United States Patent
Köppl et al.

[11] Patent Number: 5,820,688
[45] Date of Patent: Oct. 13, 1998

[54] METHOD FOR THE TREATMENT OF SEMICONDUCTOR MATERIAL

[75] Inventors: Franz Köppl, Erlbach; Friedrich Steudten, Burghausen; Matthäus Schantz, Reut, all of Germany

[73] Assignee: Wacker-Chemie GmbH, Munich, Germany

[21] Appl. No.: 846,151

[22] Filed: Apr. 25, 1997

[30] Foreign Application Priority Data

May 10, 1996 [DE] Germany .................. 196 18 974.8

[51] Int. Cl.⁶ .................................................. B08B 7/02
[52] U.S. Cl. ............................ 134/2; 134/3; 134/16; 134/25.1; 134/34; 134/902
[58] Field of Search .................. 134/1, 1.3, 2, 6, 134/7, 25.1, 16, 34, 32, 902, 36

[56] References Cited

U.S. PATENT DOCUMENTS

| | | |
|---|---|---|
| 3,031,363 | 4/1962 | Soper ........................... 134/902 X |
| 4,403,735 | 9/1983 | Weaver . |
| 4,588,571 | 5/1986 | Bildl et al. ..................... 134/25.1 X |
| 5,217,163 | 6/1993 | Henshaw . |
| 5,327,921 | 7/1994 | Mokuo et al. ..................... 134/182 |
| 5,368,054 | 11/1994 | Koretsky et al. . |
| 5,384,989 | 1/1995 | Shibano . |
| 5,656,097 | 8/1997 | Olesen et al. ........................ 134/1 |
| 5,660,335 | 8/1997 | Koppl et al. ......................... 241/1 |
| 5,681,396 | 10/1997 | Madanshetty ..................... 134/1.3 |

OTHER PUBLICATIONS

Handbook of Semiconductor Wafer Cleaning Technology, ed. W. Kern, Noyes Publications, pp. 405–409, 1993.

*Primary Examiner*—Jill Warden
*Assistant Examiner*—Alexander Markoff
*Attorney, Agent, or Firm*—Collard & Roe, P.C.

[57] ABSTRACT

A method for the treatment of semiconductor material in a liquid bath has the treatment based upon the occurrence of cavitation being brought about in the liquid bath. The semiconductor material is contacted with a cavitating liquid in order to clean fragments of the semiconductor material and to round fracture edges of the fragments.

6 Claims, 1 Drawing Sheet

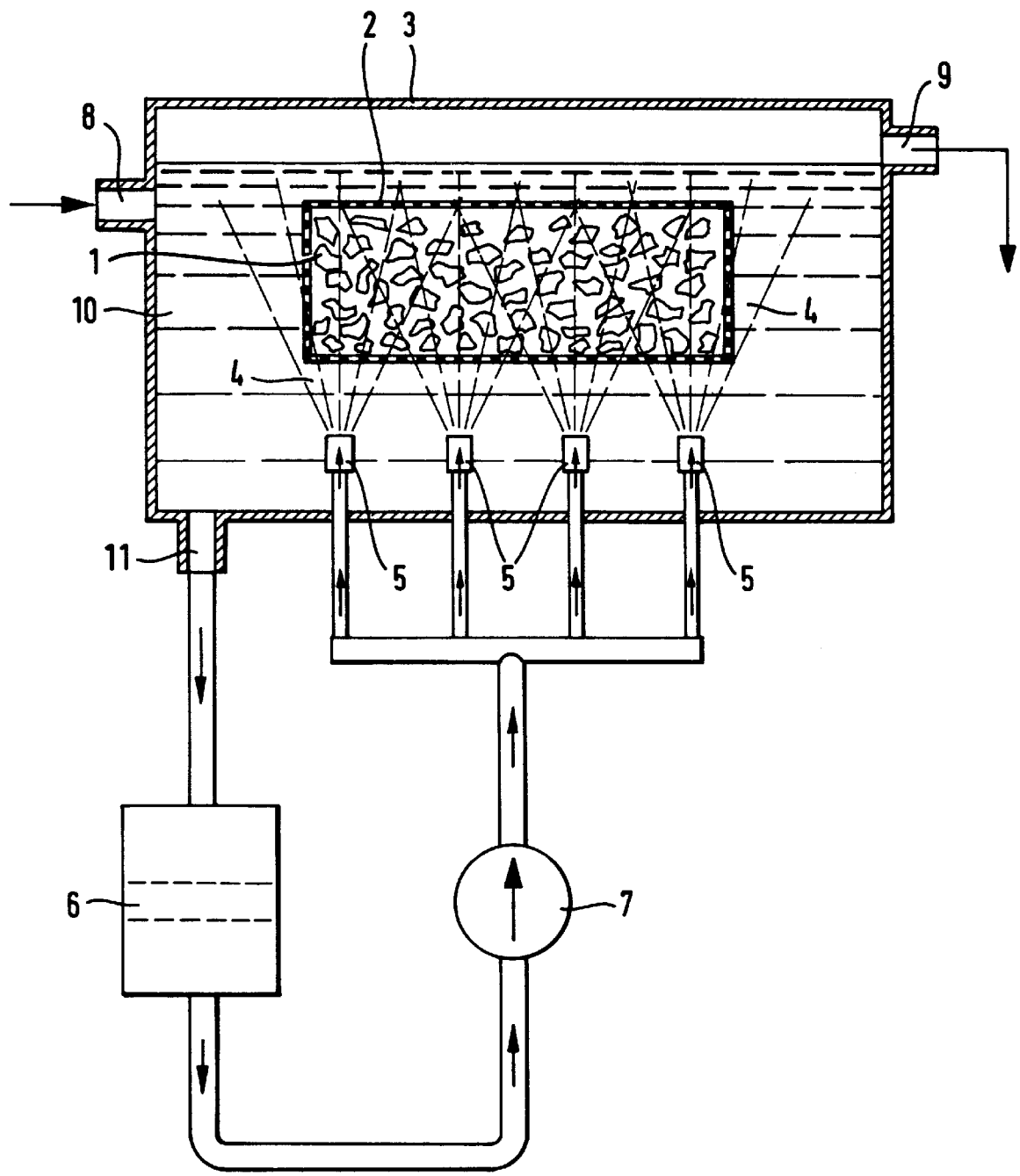

METHOD FOR THE TREATMENT OF SEMICONDUCTOR MATERIAL

BACKGROUND OF THE INVENTION

1. Field of the Invention

The invention relates to a method for the treatment of semiconductor material in a liquid bath.

2. The Prior Art

Semiconductor material is normally treated in liquid baths for cleaning purposes, cleaning also meaning rinsing or chemical etching. It is disclosed in U.S. Pat. No. 5,368,054 that, in the case of semiconductor wafer cleaning, an improvement in the cleaning action is possible as a result of the additional use of electrically generated ultrasound.

However, the result of cleaning is unsatisfactory in the case of heavily contaminated semiconductor material, in particular in the case of semiconductor material which has been comminuted mechanically or in some other way to form fragments, even if the cleaning has been promoted by electrically generated ultrasound. Troublesome particles and foreign atoms can furthermore be detected on the surfaces, which sometimes have sharp edges, of the fragments. The particles are as a rule dust which is produced in the comminution of the semiconductor material and while the fragments are being transported. The dust may contain not only particles originating from the semiconductor material, but also abraded material from the crusher tool and from the transportation containers, which are normally made of plastic. During the cleaning, those particles, in particular, are only inadequately removed which adhere to the surface of the fragments in the shadow of the irradiated ultrasonic waves. In addition, the known, also ultrasonically promoted cleaning measures are scarcely able to prevent fresh particles being produced by abrasion during the transportation of semiconductor material which has already been cleaned. To avoid this, additional effort is required which involves the removal of edges critically responsible for the abrasion from the fragments by chemical etching. Plastic particles already present are generally not attacked by the etchants used.

SUMMARY OF THE INVENTION

The present invention achieves the object of simplifying the cleaning treatment of semiconductor material and making it more effective.

The invention relates to a method for treating semiconductor material in a liquid bath, comprising bringing about the occurrence of cavitation in the liquid bath.

The essential advantage of the method is that, in the treatment of semiconductor material, contaminants adhering to the surfaces are effectively removed, even at inaccessible locations. In addition, the method reduces sharp edges on the surface of the semiconductor material so that the risk of contamination of cleaned semiconductor material by freshly produced particles is greatly reduced and is appreciably less. Responsible for the reduction in sharp edges is the occurrence of imploding bubbles (cavitation), by which exposed edges of semiconductor material are blasted off, substantially rounded surfaces being left behind.

The method is therefore used with particular advantage for the treatment of semiconductor material which is present in the form of fragments which are possibly graded. The mean particle diameter of the fragments is, for example, 5 to 150 mm. It is not important whether the fragments have been produced by comminution of monocrystalline or polycrystalline material. The type of comminution method does not play a particular part either. It is particularly preferred to use the method to treat fragments which are subsequently to be melted and to be used to produce single crystals. For this use, it is of decisive importance that the contamination of the melt with particles and undesirable foreign substances be as low as possible.

For the purpose of the treatment, the semiconductor material is introduced into a liquid bath usually by immersing in the bath. Pure water, aqueous cleaning agents and aqueous etchants with an acidic or alkaline reaction are preferred as liquids. The occurrence of cavitation in the liquid bath is preferably brought about with the aid of one or more nozzles which transmit the liquid under pressure.

Suitable nozzles are known in a wide variety of embodiments, and the structure of the nozzles is therefore not part of the present invention. In this connection, U.S. Pat. No. 5,217,163 and the literature cited therein may be mentioned as representative of the prior art. It is furthermore preferable to align the nozzle so that the liquid jet leaving it is directed at the semiconductor material. It is particularly preferable to provide a multiplicity of nozzles at regular intervals in order to achieve, in this way, a uniform and dense distribution of liquid regions in which cavitation takes place. Thus, the cavitating liquid contacts the semiconductor material to cause the cleaning thereof and the rounding of the fracture edges. The semiconductor material is then preferably kept in these liquid regions in a container whose walls are permeable to the liquid. Suitable as receiving containers are, in particular, perforated plastic containers or plastic-coated, perforated containers, for example large-mesh plastic baskets.

To increase the cleaning action, the liquid may be circulated in the liquid bath. In one embodiment preferably, some of the liquid is constantly replaced by fresh liquid. In another preferred embodiment, some of the liquid is removed, filtered and the filtrate returned to the liquid bath. It is particularly preferable to return the filtrate to the liquid bath through the nozzles used, which generate the cavitation.

BRIEF DESCRIPTION OF THE DRAWINGS

Other objects and features of the present invention will become apparent from the following detailed description considered in connection with the accompanying drawings. It is to be understood, however, that the drawings are designed as an illustration only and not as a definition of the limits of the invention.

An embodiment of the invention is described below with reference to the drawing FIGURE. The FIGURE is a diagrammatic sectional drawing of a device which is suitable for carrying out the method according to the invention.

DETAILED DESCRIPTION OF THE PREFERRED EMBODIMENT

Turning now in detail to the drawings, the FIGURE shows a tank 3 containing a liquid bath 10. The tank may be open or sealed with a lid. A receiving container 2 filled with semiconductor material 1 is immersed in the liquid bath. Disposed below the receiving container 2 is an array of nozzles 5 which are laid out in grid-like fashion and which are connected to a pump 7. The pump 7 conveys liquid under pressure from the tank 3 through the nozzles 5 back into the liquid bath 10. The nozzles are formed in such a way that cavitation occurs in the liquid jet 4 which leaves a nozzle. The semiconductor material 1 is disposed in the region in which the liquid jets 4 act. The liquid for operating the nozzles is drawn from the tank 3 through an outlet opening 11 and fed to the pump 7 via a filter 6. To be able to remove effectively, in particular, particles floating on the surface of the liquid bath, the tank 3 is equipped with an outlet 9 via which the liquid from the surface region is able to leave the tank 3. At the same time, an inlet 8 is provided through which fresh liquid is fed to the liquid bath.

EXAMPLE

A batch of 30 kg of polycrystalline silicon fragments was treated in a device according to the FIGURE. The cavitation was generated by 75 nozzles which were uniformly distributed in a horizontal arrangement in the tank below the perforated receiving basket. Filtered, fully demineralized water at a pressure of 15 bar was fed to the nozzles. The amount circulated between the liquid bath and the pump was 25 m$^3$/h, and the supply of fresh water was 1 m$^3$/h. The treatment of the batch, that is to say the cleaning of the fragments and the rounding of the fracture edges was completed after a treatment time of 2 min.

Accordingly, while only several embodiments of the present invention have been shown and described, it is obvious that many changes and modifications may be made thereunto without departing from the spirit and scope of the invention according to the appended claims.

What is claimed is:

1. A method for treatment of semiconductor material in a liquid bath, comprising:

providing a liquid bath;

placing fragments of semiconductor material into a container whose boundaries are permeable to liquid and impermeable to the fragments;

immersing container containing the fragments of semiconductor material in the liquid bath;

providing at least one nozzle in the liquid bath;

directing a jet of the liquid from said at least one nozzle at the fragments of semiconductor material; and bringing about cavitation in the liquid bath in order to contact the fragments of semiconductor material with the cavitating liquid thereby cleaning the fragments and rounding fracture edges of the fragments, wherein said liquid is selected from the group consisting of water, aqueous cleaning liquids and aqueous etchants.

2. The method as claimed in claim 1, comprising replacing some of the liquid from the liquid bath by fresh liquid.

3. The method as claimed in claim 1, wherein the semiconductor material is selected from a group consisting of monocrystalline silicon and polycrystalline silicon.

4. The method as claimed in claim 1, wherein the semiconductor material is silicon.

5. The method as claimed in claim 1, comprising removing some of the liquid from the liquid bath;

filtering the removed liquid to produce a filtrate; and returning the filtrate to the liquid bath.

6. A method for treatment of semiconductor material in a liquid bath, comprising:

providing a liquid bath;

providing in the liquid bath a multiplicity of nozzles at regular intervals;

placing fragments of semiconductor material into a container whose boundaries are permeable to liquid and impermeable to the fragments;

immersing container containing the fragments of semiconductor material in the liquid bath;

directing jets of the liquid from said multiplicity of nozzles at the fragments of semiconductor material; and bringing about cavitation in the liquid bath in order to contact the fragments of semiconductor material with the cavitating liquid thereby cleaning the fragments and rounding fracture edges of the fragments, wherein said liquid is selected from the group consisting of water, aqueous cleaning liquids and aqueous etchants.

* * * * *